(12) United States Patent
Sullivan et al.

(10) Patent No.: US 8,483,858 B2
(45) Date of Patent: Jul. 9, 2013

(54) SYSTEM AND METHOD FOR OPTIMIZING MACHINING SIMULATION

(75) Inventors: Alan Sullivan, Middleton, MA (US); William S. Yerazunis, Acton, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 589 days.

(21) Appl. No.: 12/751,591

(22) Filed: Mar. 31, 2010

(65) Prior Publication Data

US 2011/0245954 A1    Oct. 6, 2011

(51) Int. Cl.
  *G06F 19/00* (2011.01)
  *G06F 17/50* (2006.01)
  *G06F 7/60* (2006.01)
  *G06F 17/10* (2006.01)
  *G06T 17/00* (2006.01)
  *G06G 7/48* (2006.01)

(52) U.S. Cl.
  USPC ........... 700/97; 700/96; 700/98; 700/182; 700/184; 700/187; 700/193; 700/194; 703/1; 703/2; 703/6; 703/7; 345/420

(58) Field of Classification Search
  USPC ............ 700/173, 176, 182, 184, 187, 96–98; 700/193–194; 703/6–7, 1–2; 345/420
  See application file for complete search history.

(56) References Cited

U.S. PATENT DOCUMENTS

| | | | |
|---|---|---|---|
| 5,542,036 A * | 7/1996 | Schroeder et al. | 345/424 |
| 6,396,492 B1 * | 5/2002 | Frisken et al. | 345/420 |
| 6,628,280 B2 * | 9/2003 | Perry et al. | 345/420 |
| 6,724,393 B2 | 4/2004 | Perry | |
| 6,741,246 B2 * | 5/2004 | Perry et al. | 345/420 |
| 6,826,024 B2 | 11/2004 | Takeda | |
| 7,042,458 B2 | 5/2006 | Frisken | |
| 8,010,328 B2 * | 8/2011 | Frisken et al. | 703/6 |
| 8,265,909 B2 * | 9/2012 | Frisken et al. | 703/1 |
| 2002/0130860 A1 * | 9/2002 | Perry et al. | 345/420 |
| 2002/0130877 A1 * | 9/2002 | Perry et al. | 345/581 |

OTHER PUBLICATIONS

A New Space Subdividion for Ray Tracing CSG Solids, by Jung-Hong Chuang et al., 7 pages, Nov. 1995.*
Geometric Modeling for Swept Volume of Moving Solids, by W.P. Wang et al., 10 pages, Dec. 1986.*

* cited by examiner

*Primary Examiner* — Ronald Hartman, Jr.
(74) *Attorney, Agent, or Firm* — Gene Vinokur; Dirk Brinkman

(57) ABSTRACT

Embodiments of the invention disclose a method for optimizing a simulation of a machining of a workpiece performed by removing a set of swept volumes from a volume of the workpiece, wherein the volume is partitioned into a set of cells, comprising the steps of: associating with each cell a subset of distance fields representing a subset of swept volumes intersecting with the cell, wherein at least part of the subset of swept volumes forms a composite surface of the cell; subjecting the cell with a set of rays incident to the cell from at least one direction; and selecting a distance field of the subset of distance fields into an optimal subset associated with the cell, wherein a boundary of the swept volume represented by the distance field intersects with at least one ray at a point of intersection lying on the composite surface.

20 Claims, 15 Drawing Sheets

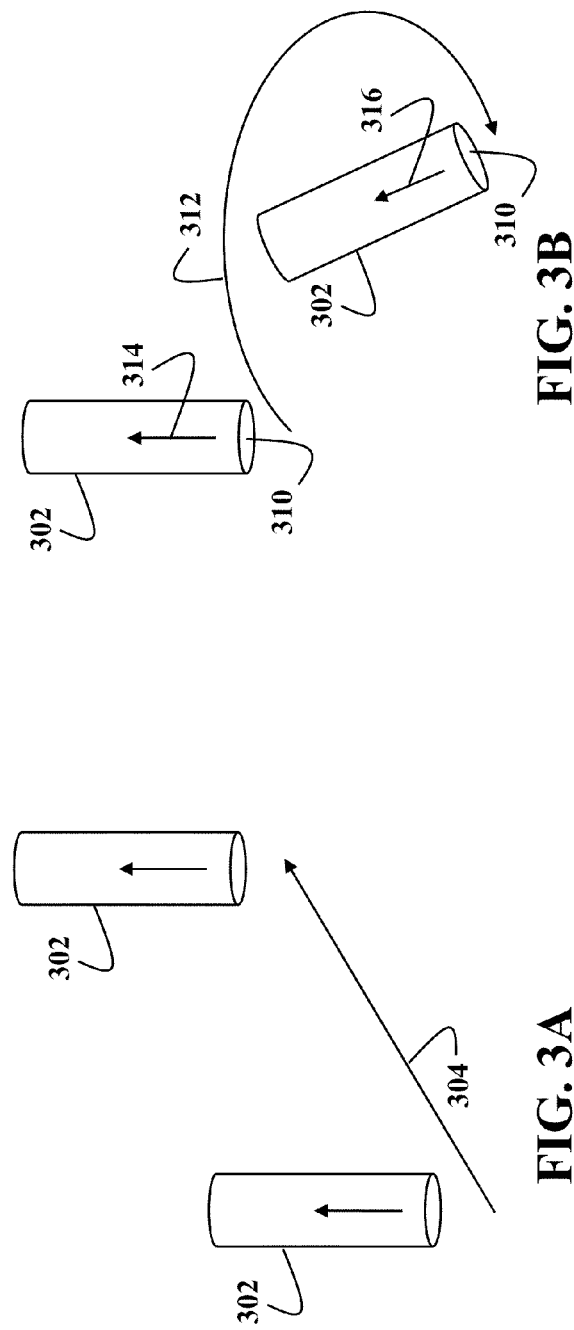

500

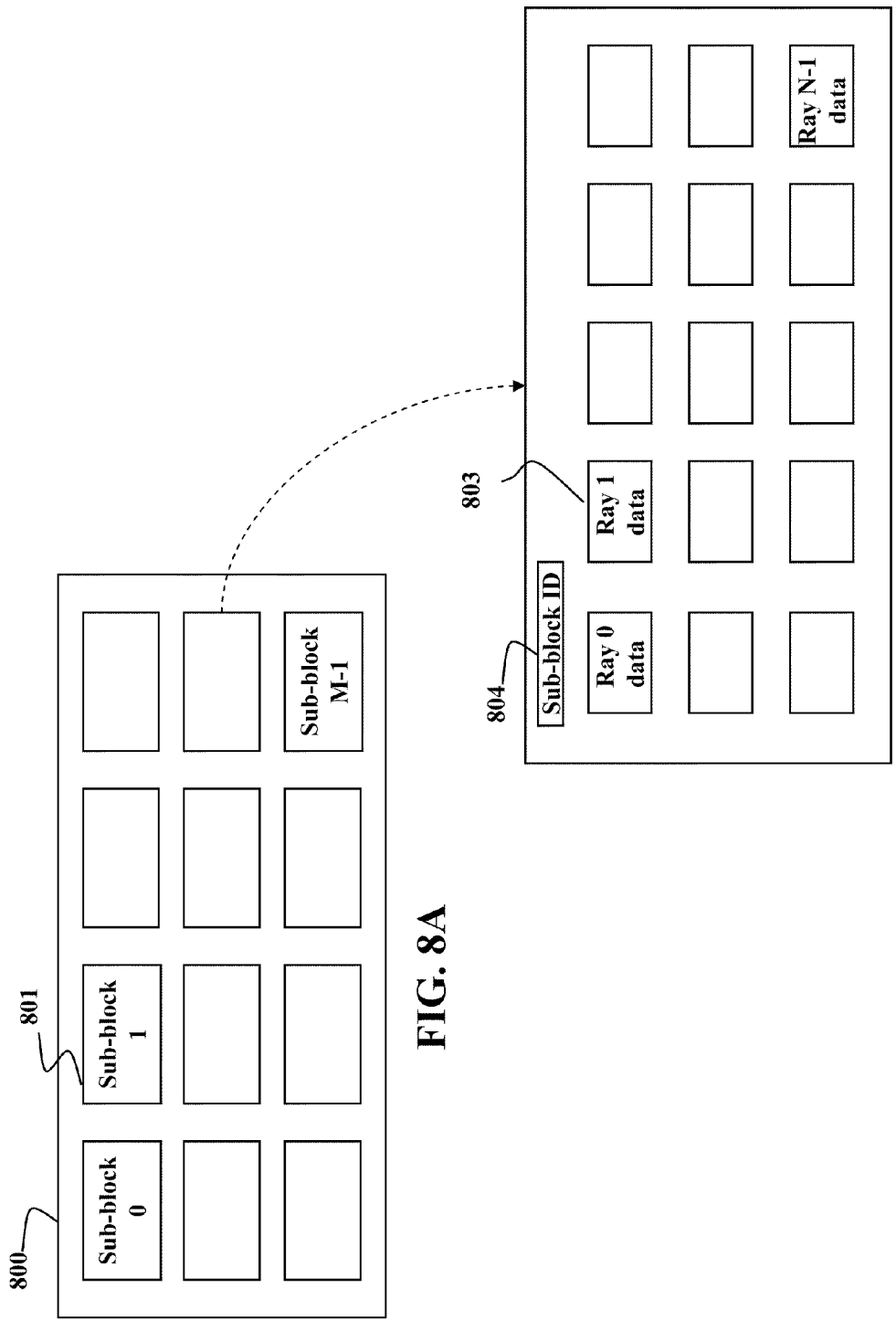

900

| Distance field identifier ≠ -1? \ Intersection with new distance field boundary? | YES | NO |
|---|---|---|
| YES | Compute value of cached distance field at new intersection point. If d > 0 add new distance field to optimal subset, else add cached distance field to optimal subset. | Compute value of new distance field at cached point. If d > 0 add cached distance field to optimal subset. |
| NO | Compute value of other distance fields at intersection point. If all d > 0 then add new distance field to optimal subset. | Nothing can be learned from this ray |

FIG. 10

SYSTEM AND METHOD FOR OPTIMIZING MACHINING SIMULATION

FIELD OF THE INVENTION

The invention relates generally to machining simulation, and more particularly to determining an optimal subset of distance fields to optimize a simulation of a machining process.

BACKGROUND OF THE INVENTION

Numerically Controlled Milling

Simulating a process of numerically controlled (NC) machining (e.g. milling or turning) is of fundamental importance in computer aided design (CAD) and computer aided manufacturing (CAM). During the simulation, a computer model of a workpiece is edited with a computer representation of a tool, e.g., an NC milling tool, and a set of motions of the tool, which simulate the machining process.

The simulation visualizes the model of the workpiece and the representation of the tool in order to detect potential collisions between parts, such as the workpiece and the tool holder, and to verify a final shape of the workpiece.

The final shape of the workpiece is affected by the selection of the tool and the motions of the tool. Instructions for controlling the motions are typically generated using a computer aided manufacturing system from a graphical representation of a desired final shape of the workpiece. The motions are typically implemented using numerical control programming language, also known as preparatory code or G-Codes, see the following standards RS274D and DIN 66025/ISO 6983.

The G-Codes generated by the computer aided manufacturing system can fail to produce an exact replication of the desired final shape. In addition, the movement of the tool is governed by motors of the NC machining system, which have limited speeds, ranges of motion, and abilities to accelerate and decelerate, so that the actual tool motions sometimes do not exactly follow the NC machining instructions.

Discrepancies between the actual final shape of the workpiece and the desired final shape of the workpiece can be very small, and difficult to see. In some situations, these discrepancies result in undesirable gouges or nicks in the surface of the final shape of the workpiece with sizes on the order of a few micrometers in depth and width, and tens of micrometers in length.

Typically, a set of NC machine instructions is tested by machining a test workpiece made of softer, less expensive material prior to machining the desired part. If visual inspection of the test workpiece locates undesirable discrepancies in the test workpiece, then the NC machining instructions are modified accordingly.

However, this manual testing is time consuming and expensive. Time for machining a single test workpiece may be on the order of hours and several iterations may be required before an acceptable set of NC machine instructions is attained. Thus, it is desirable to test for these discrepancies using computer-based simulation and rendering. Examples of the computer-based simulation are described in U.S. patent application Ser. No. 12/495,588 and No. 12/468,607, incorporated herein by reference.

Tools

FIG. 2A shows a set of typical tools 202, 204, 206, and 208 used in NC milling. When a tool is moved relative to a workpiece 210, the tool carves material out of the workpiece. Here, the tools 202, 204, 206, and 208 remove material, commonly referred as a "swept volume," corresponding to surfaces 212, 214, 216, and 218 from the workpiece. The shape of the material removed by each tool is determined by the shape of the tool, and the path of the tool relative to the workpiece.

Swept Volumes

During machining, the tool moves relative to the workpiece according to a prescribed motion of the tool, i.e., a tool path, where the tool path can include information about the relative position, orientation, and other shape data of the tool with respect to the workpiece.

As the tool moves along the tool path, the tool carves out the swept volume. During machining, as the tool moves along the tool path, a portion of a volume of the workpiece that is intersected by the swept volume is removed. This material removal can be modeled in the computer as a constructive solid geometry (CSG) difference operation, in which the portion of the workpiece is removed from the workpiece using a CSG subtraction operation of the swept volume from the workpiece.

FIG. 2B shows the swept volume 260 of a shape 250 that is moved along a path 252. The path 252 specifies a position of a particular point of the shape 250 as a function of time. The path can specify an orientation 256, 257, and 258 of the shape as a function of time. The path can also specify a scale of the shape or an arbitrary transformation of the shape as a function of time. In FIG. 2B, the original position, orientation, and geometry of a shape 250 is transformed to a final position, orientation, and geometry of the shape 254 as it moves along the path.

FIG. 3A shows a linear path, in which a tool 302 is moved along a straight line 304.

FIG. 3B shows a circular arc path, in which a tip 310 of the tool 302 is moved along a circular arc 312, and an original axis direction 314 of the tool is transformed to a final axis direction 316 at the end of the path.

FIG. 3C shows a curved path, in which the tip 310 of the tool 302 is moved along a curve 320.

Other possible path forms include positioning the tool at a point, moving the tool along a sequence of lines known as a polyline, moving the tool along a spiral or helical curve, moving the tool along a polynomial curve, such as a quadratic Bezier curve or a cubic Bezier curve, or a sequence of polynomial curves known as a piecewise polynomial curve to name but a few. Any form of path that can be simulated can be considered, including a path defined by a procedure such as a path that is influenced by the shape or material composition of the workpiece.

Distance Fields

A distance field, d(p), of an object is a scalar field whose value at point p in space is the distance from a point p to the surface of the object. Many possible distance fields are known in the prior art, but the most common and useful is a Euclidean distance field where the distance is the minimum distance to the surface of the object, which is defined as $d(p_s)=0$.

Additionally, the distance field is signed to distinguish the outside of the object from the inside, e.g., the d(p)>0 inside and d(p)<0 outside. Also the gradient vector of the distance field at p points in the direction of the minimum distance, and at the surface of the object the normalized gradient vector is equal to the normal vector of the surface. Distance fields are a form of implicit functions and are an effective representation for rendering and editing shapes, as described in U.S. Pat. Nos. 6,396,492, 6,724,393, 6,826,024, and 7,042,458, incorporated herein by reference.

Adaptively sampled distance fields (ADFs) use detail-directed sampling to provide a space and time efficient representation of the distance fields. ADFs store the distance field in a spatial hierarchy of cells. Each cell contains distance data and a reconstruction method for reconstructing the portion of the distance field associated with the cell. Distance data can include the value of the distance field, as well as gradients and partial derivatives of the distance field. The distance field of the cell can be reconstructed as needed to reduce memory and computation requirements.

ADFs can be used to simulate milling using CSG operations. The workpiece to be milled and the milling tool can be represented as ADFs. The simulated milling process can generate an ADF of the simulated workpiece explicitly, for example by modifying an ADF of the workpiece. Alternatively, the simulated workpiece can be represented implicitly as a composite ADF. The composite ADF stores distance fields of the workpiece and the milling tool, operators corresponding to the distance fields, such as a CSG subtraction operator for the milling tool, and a distance field reconstruction method that combines the stored distance fields on demand during rendering or other processing.

The milling tool can be represented by a tool distance field. The tool path can be represented by a parametric function. A swept volume distance field is defined to represent the swept volume generated by moving the milling tool along the path, where the swept volume distance field is defined in a continuous manner according to a swept volume reconstruction method. The swept volume reconstruction method can reconstruct the swept volume distance field at a sample point.

An example of the sample point of particular interest is a point on an isosurface of the distance fields of any objects where a value for distance field d equals zero, i.e., d=0. As referred herein, a zero value isosurface of the distance field of an object is a boundary of the object, e.g., the boundary of the workpiece, or the boundary of the swept volume.

FIG. 1A is a 2D illustration of a composite ADF 100 that consists of a spatial hierarchy of cells, e.g., 101, 102 and 103, representing portions of the volume of the workspace as well as distance fields whose boundaries are indicted. In this example, distance fields 104-107 are planes that defined the boundary of the initial workpiece. Distance fields 108-110 are three distance fields representing sweeps of a ball end mill tool. Each cell in the composite ADF is associated with a subset of the set of distance fields representing the original workpiece and the swept volumes of the milling tool. For example, associated with cell 111 are distance fields 104, 108, and 109 that together determine the composite surface within cell 111. Also associated with the cell is a procedural reconstruction method, such as CSG difference, for combining the subset of the set of distance fields to reconstruct the composite distance field of the workpiece. The composite surface is defined to be the simulated boundary of the workpiece composed of patches of the boundaries of the original workpiece distance fields and the swept tool distance fields.

The subset of the distance fields associated with the cell can be selected by a number of methods. For example, the subset can be limited only to those distance fields where the absolute value of the distance from a center of the cell to the boundary is less than a diameter of a sphere completely enclosing the cell. Alternatively, the subset can be limited only to distance fields representing a swept volume having a boundary wherein at least a portion of the boundary intersects with the cell. Those distance fields can be determined, e.g., by searching, using a boundary/cell intersection test, for a point within the cell where the distance field is equal to zero.

It is desirable, that the subset of the set of distance fields associated with a cell includes only those distance fields that actually form the composite surface within the cell to maximize simulator performance by minimizing the number of distance fields that must be processed during a geometric operation, e.g., rendering. Unfortunately, the aforementioned methods of determining the subset of the distance fields of the cell can result in poor simulator performance, because a number of distance fields of the subset found by those methods can represent swept volumes that enter the cell, but do not form a portion of the workpiece boundary.

FIG. 1 shows an example of a conventional representation of a portion of the workpiece. The composite ADF representing the workpiece includes the set of cells, e.g., a cell 101, and a set of distance fields 102-105 representing the swept volumes of the tool such as the swept volume 110. The portion of the workpiece 107 is represented by the cell 101 and the subset of the swept volume distance fields 103-105. Because a swept volume distance field 102 does not intersect with boundaries of the cell, this distance field is typically not included in the subset. However, as can be seen in this example, the swept volume distance fields 103-104 do not form a portion of the boundary of the workpiece, and thus also should not be included in the subset.

As a specific example, consider a cubic cell aligned to the x, y, and z axes with a side dimension of 400 microns and a spherical tool of radius 2 mm moving in parallel sweeps parallel to the x axis in the x, y plane, where the sweeps are separated by 50 microns, and the tool height is such that the minimum point of the tool is very slightly above the bottom of the cell. Then, 56 tool sweep volumes have the boundaries within the cell, but only 9 of the sweep volumes form the boundary of the workpiece.

Therefore to optimize the performance of the simulation of the milling process, there is a need to optimize the subset of distance fields associated with the cell.

SUMMARY OF THE INVENTION

It is an object of the subject invention to optimize the performance of the simulation of the milling process.

It is further object of the invention to optimize a subset of distance fields representing a workpiece and swept volumes.

In various embodiments of the invention, the workpiece and the swept volumes are represented with distance fields. Associate with a cell is a subset of distance fields that initially includes the distance fields representing the boundaries intersecting with the cell. Embodiments of the invention optimize the subset forming an optimal subset that includes the distance fields representing the boundaries that forms the composite surface of the workpiece.

The embodiments are based on a realization that if the composite surface of the workpiece within the cell and formed by removal of swept volumes from the workpiece is subjected to rays incident to the cell and/or the composite surface, then points of intersection of those rays with boundaries of the swept volumes and the composite surface indicate swept volumes that actually formed the composite surface.

One embodiment of the invention discloses a method for optimizing a simulation of a milling of a workpiece performed by removing a set of swept volumes from a volume of the workpiece, wherein the volume is partitioned into a set of cells, comprising the steps of: associating with each cell a subset of distance fields representing a subset of distance field boundaries intersecting with the cell, wherein at least part of the subset of boundaries forms a composite surface of the workpiece within the cell; subjecting the cell with a set of rays incident to the cell from at least one direction, wherein each ray represents a propagation of a straight line; and selecting a distance field of the subset of distance fields into an optimal subset associated with the cell, wherein a boundary of the swept volume represented by the distance field intersects with at least one ray at a point of intersection lying on the composite surface, wherein the steps of the method are performed by a processor.

Another embodiment discloses a method for optimizing a simulation of a milling of a workpiece performed by removing a set of swept volumes from a volume of the workpiece, wherein the volume is partitioned into a set of cells, and associated with each cell is a subset of swept volumes intersecting the cell such that at least part of the subset of swept volumes forms a composite surface of the cell, comprising the steps of: subjecting the cell with a set of rays incident to the cell, wherein a ray represents a propagation of a straight line toward the cell; and selecting a swept volume of the subset of swept volume into an optimal subset associated with the cell, wherein a boundary of the swept volume intersects with at least one ray at a point of intersection lying on the composite surface.

Yet another embodiment discloses a system for optimizing a simulation of a milling of a workpiece performed by removing a set of swept volumes from a volume of the workpiece, wherein the volume is partitioned into a set of cells, comprising: means for associating with each cell a subset of distance fields representing a subset of swept volumes intersecting with the cell, wherein at least part of the subset of swept volumes forms a composite surface of the cell; means for subjecting the cell with a set of rays incident to the cell from at least one direction, wherein each ray represents a propagation of a straight line; and a processor configured to select a distance field of the subset of distance fields into an optimal subset associated with the cell, wherein a boundary of the swept volume represented by the distance field intersects with at least one ray at a point of intersection lying on the composite surface.

BRIEF DESCRIPTION OF THE DRAWINGS

FIGS. 3A-3C are schematics of different paths of a milling tool;

FIG. 8A-8B are examples of configuration of computer memory according an embodiment of the invention; FIGS. 10 and 11A-11C are examples of outcomes of the determining a distance field representing a boundary forming a composite surface according to an embodiment of the invention.

DETAILED DESCRIPTION OF THE PREFERRED EMBODIMENT

System Overview

Figure 1A:
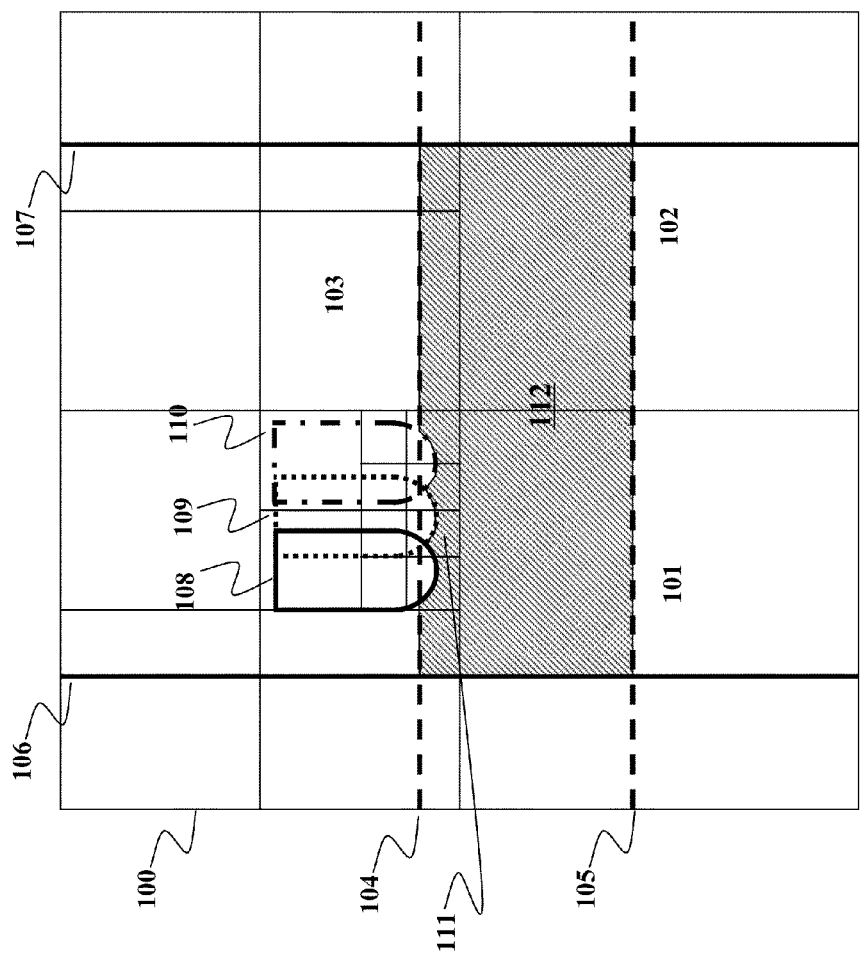
FIG. 1A is a schematic of a composite ADF representing a machined workpiece.
Figure 1B:
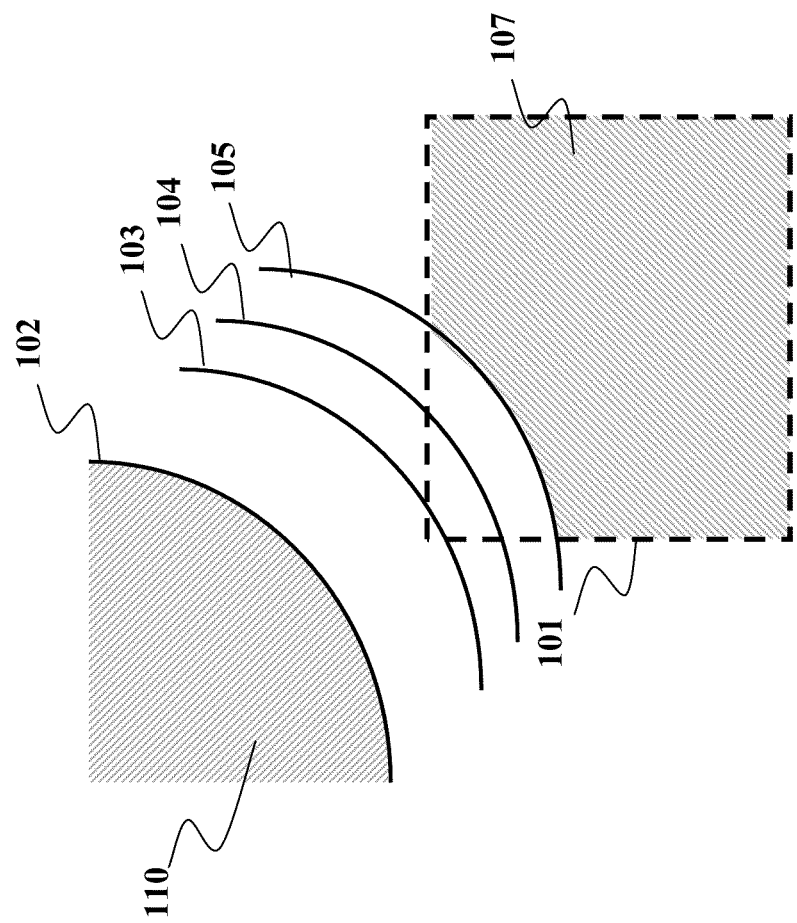
FIG. 1B is schematic of an example of a conventional representation of a portion of a workpiece.
Figure 2A:
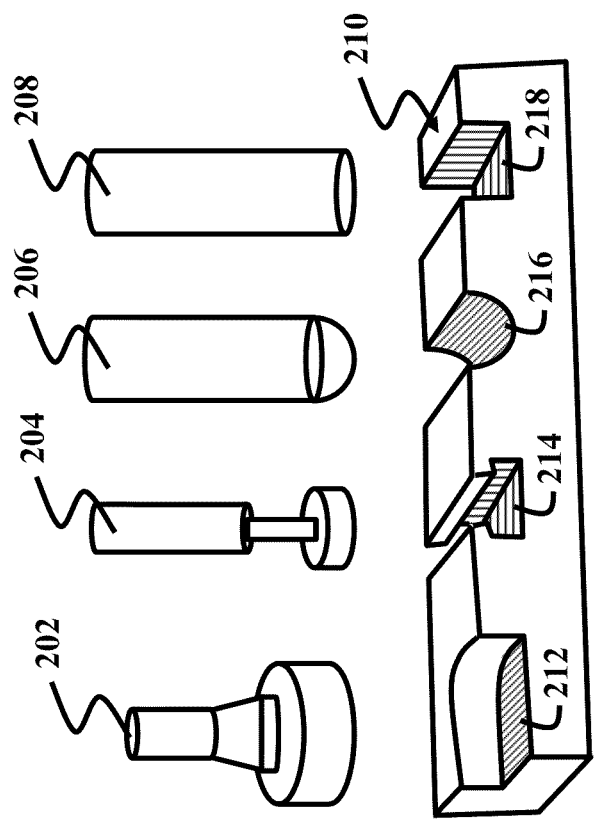
FIG. 2A is a schematic of tools used for milling and swept volumes removed from the workpiece by moving the tools along a path.
Figure 2B:
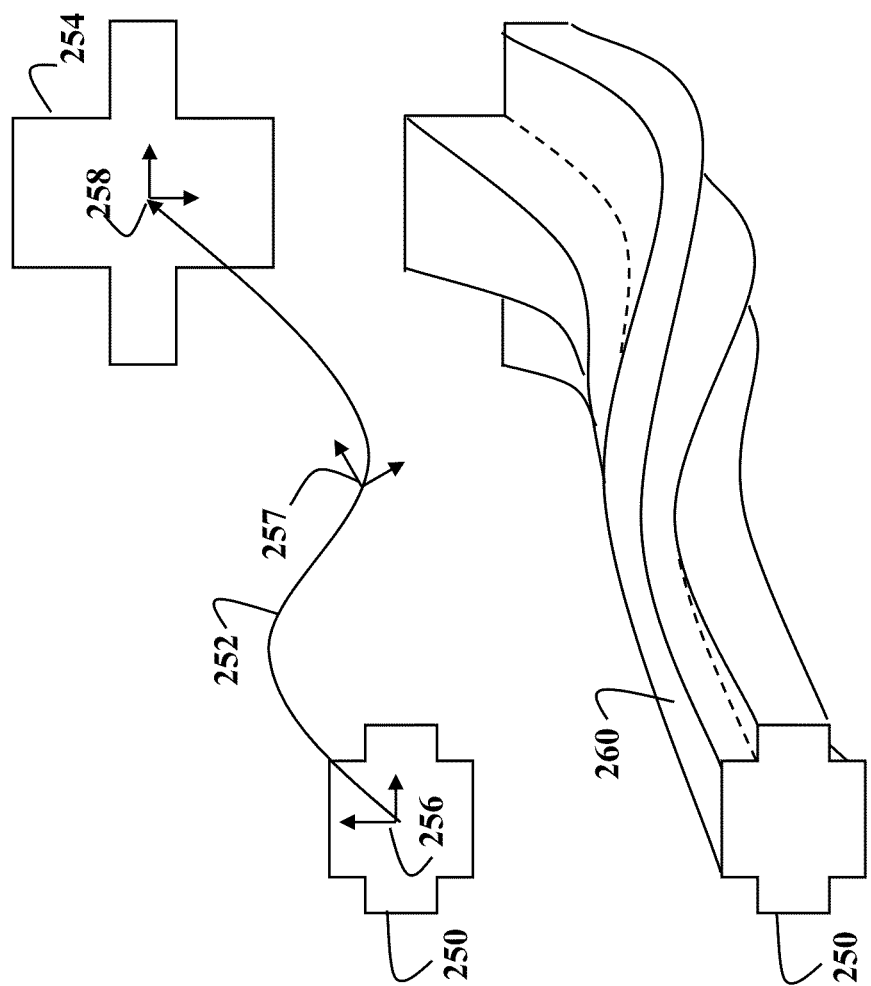
FIG. 2B is a schematic of a swept volume determined by sweeping a 2D shape along a curved path.
Figure 4A:
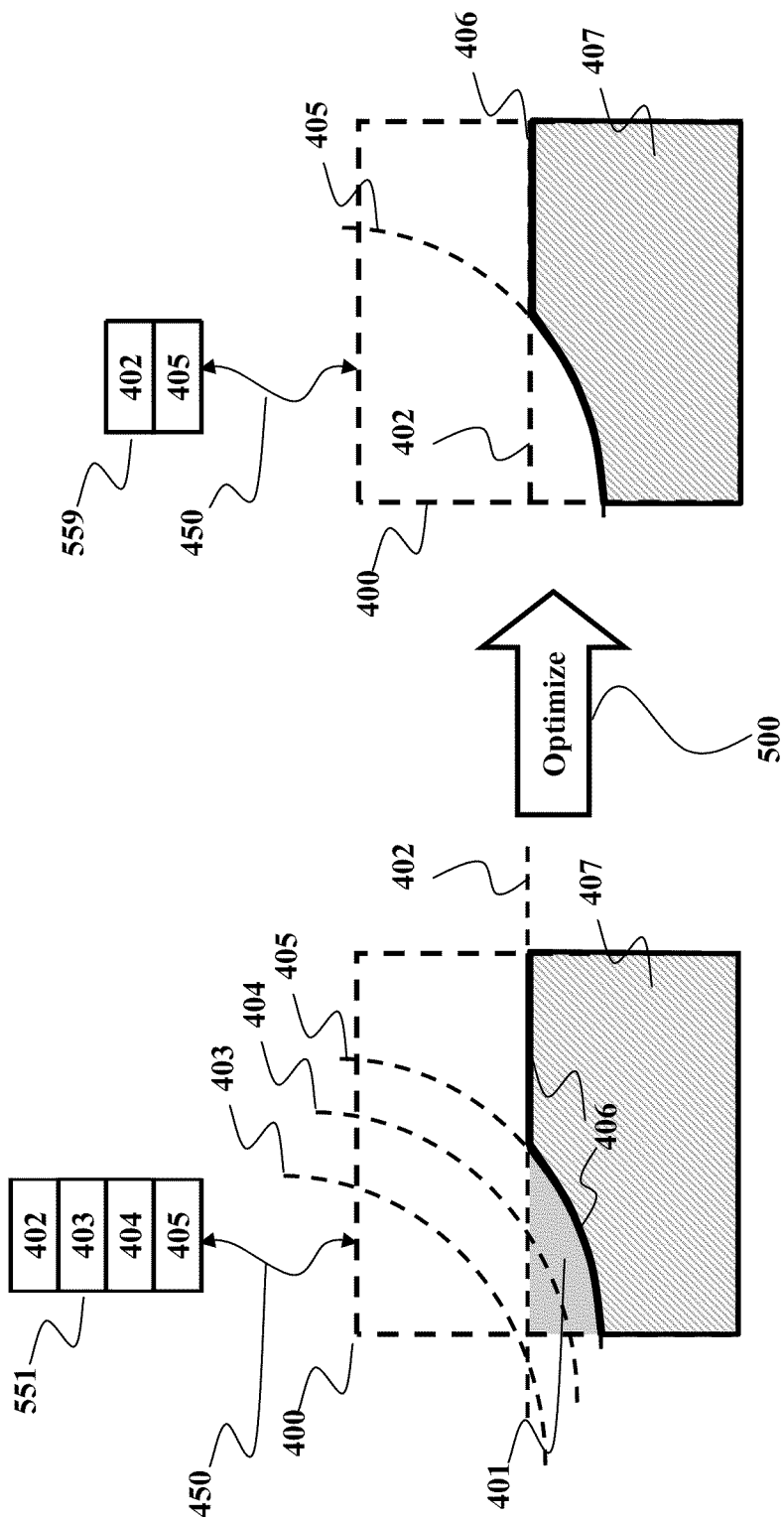
FIG. 4A is a 2D schematic diagram of a cell with multiple boundaries forming the workpiece boundary according an embodiment of the invention.

FIG. 4A illustrates a problem addressed by embodiments of the invention. Within a cell 400, a boundary 402 defines an original surface of a workpiece 401 at the start of a simulation of a milling of the workpiece. During the simulation, boundaries of three swept volumes 403, 404, and 405 intersect with the cell. Accordingly, the swept volumes are removed from a volume of the workpiece represented by the cell. A composite surface of the workpiece 406 enclosing an interior 407 of the workpiece is formed by the boundary 402 and the boundary 405.

In various embodiments of the invention, the workpiece and the swept volumes are represented with distance fields. The cell is associated 450 with a subset 551 of distance fields that initially includes the distance fields representing the boundaries 402-405 intersecting with the cell. Embodiments of the invention optimize 500 the subset forming an optimal subset 559 that includes the distance fields representing the boundaries forming the composite surface of the workpiece, e.g., the boundaries 402 and 405.

The boundaries are defined by zero value isosurface of the distance field.

Additionally, under a common sign convention, the distance field is positive within the swept volume, zero at the boundary and negative outside. However, in the simulation of the milling process, an interior of the swept volume is external to the composite surface of the workpiece since any portion of the workpiece surface that intersects the swept volume is removed. Therefore, the embodiments of the invention negate, i.e., multiply by −1, the distance fields representing the swept volumes.

Accordingly, the boundaries of the original surface 402 and the swept volume 405 form the optimal subset of the cell and enclose the interior of the workpiece wherein a composite distance field of the workpiece is everywhere greater than zero. The boundaries 403 and 404 are outside of the composite surface, i.e. every point on these boundaries within the cell has a negative distance to the composite surface of the workpiece.

Rays

The embodiments of the invention are based on a realization that if the composite surface of the workpiece represented by the cell and formed by removal of swept volumes from the workpiece is subjected to rays incident to the cell and/or the composite surface, then points of intersection of those rays with boundaries of the swept volumes and the composite surface indicate swept volumes that actually formed the composite surface.

A ray is a mathematical construct identical to a straight line. A ray originates from a point of origin $R_0$ in 3D space and propagates in a straight line in a direction given by a vector $R_d$. The propagation of the ray can be parameterized by a time-like coordinate s such that a position of the ray in 3D space is defined by $R(s)=R_0+R_d s$.

Figure 4B:
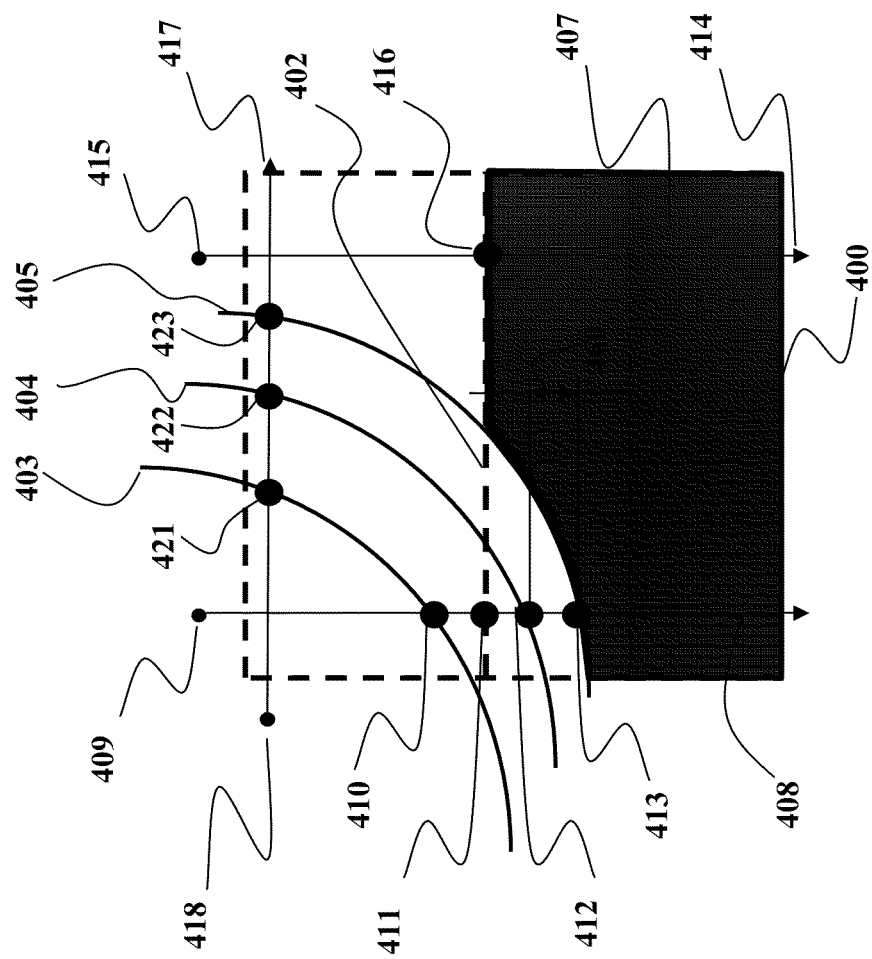
FIG. 4B-4C are a 2D schematic illustrating the intersection of rays with boundaries within a cell according an embodiment of the invention.

FIG. 4B shows a two-dimensional (2D) illustration of the intersection of rays with the boundaries of the swept volumes. For example, a ray 408 originates from a point 409, propagates in a straight line, and intersects boundaries of the swept volumes at points 410, 412 and 413 as well as the boundary of the original surface at point 411. Determining which point of intersection of the ray is on the composite surface is based on values of the distance field from the points of intersection of the ray with each of the boundaries.

The point of intersection of the ray with the boundary of the swept volume is identified by a value s resulting in a zero value of the distance field of the swept volume, i.e. d(R(s))=0. The determination of the points of intersection problem can be formulated as a conventional root finding problem having different solutions known in the art. One embodiment of the invention determines the intersection analytically. Another embodiment uses an iterative procedure, such as Newton's method and/or the false position (regula falsi) method, to determine the point of intersection between the ray and the boundary of the swept volume.

Figure 4C:
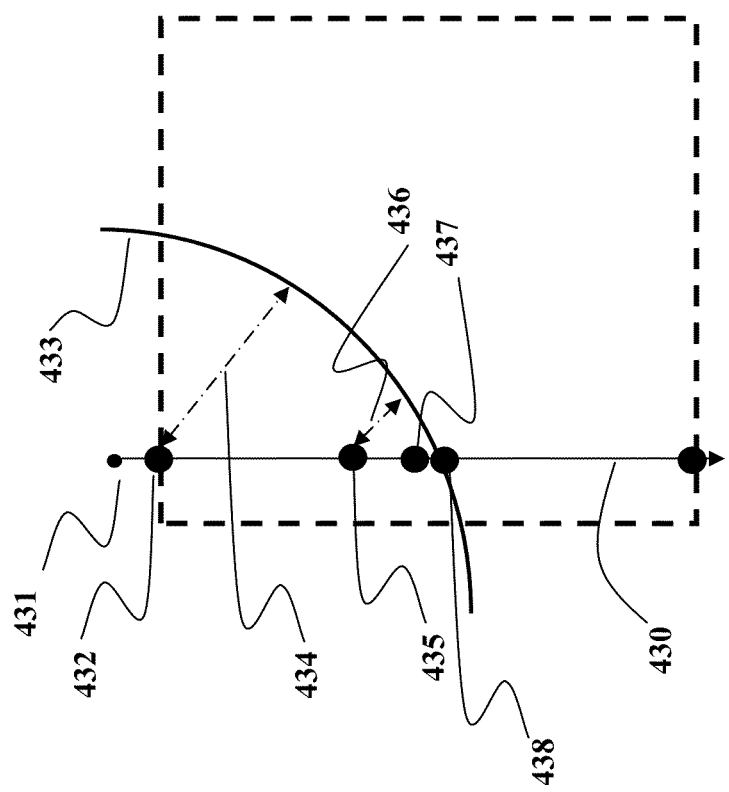

FIG. 4C illustrates a method of ray surface intersection known in the art as sphere casting. The ray 430 originates from point 431 and intersects the cell at point 432 which may be found easily by analytic ray/plane intersection. At point 432 the distance to swept volume 433 is determined from its distance field and is shown by 434. A new test point 435 determined by moving along the ray by the distance 434. The process is then iteratively repeated by computing distance 436 and then new test point 437 and then further test points until the intersection point 438 is found.

In one embodiment, the subset of distance fields 551 includes N distance fields indexed by i∈[1, N] such that a value of the distance field i at the point of intersection p is $d_i(p)$. Then, the point p is lying on the composite surface 406 if and only if $d_i(p)=0$ for a particular value of i=j∈[1, N] and $d_i(p)>0$ for all i≠j. Furthermore j is the index of the distance field that forms the composite surface indicated by the ray 408. For example, the point 413 is on the composite surface and all other points are outside the composite surface, because a distance, e.g., the distance 460, to the boundary 405 from each other points of intersection of the boundaries with the ray, i.e., the points 410-412, is positive.

Accordingly, as defined herein, a distance field from the subset of distance fields forms a portion of the composite surface, if a point of intersection of the boundary of the distance field with a ray is within the cell, and each distance in a set of distances between the point of intersection and the remaining swept volumes in the subset is positive. The distance is positive if a value of the distance field representing the boundary is positive at the point of intersection.

Typically, the cell is subjected to a set of rays from at least one direction. The rays in the set of rays are parallel to each other and spaced apart to determine all boundaries forming the composite surface. For example, another ray 414 originates from a point 415 and propagates parallel to the ray 408. The ray 414 only intersects the boundary 402 at point 416 which, as indicated by the ray 414, is on composite surface. Therefore rays originating from different points and/or propagating in different directions can each determine which, if any, of the boundaries form the composite surface.

In some instances, a subset of the rays does not indicate the boundaries of the composite surface. For example, a ray 417 originates from a point 418 and intersects the boundaries 403, 404 and 405 at points 421, 422, and 423. However, all of these points of intersection are outside of the composite surface of the cell. Also, the rays can intersect the boundaries at points outside of the cell (not shown). The points of intersection outside the cell are not valid points on the composite surface associated with the cell.

Furthermore, the boundaries can intersect the cell but do not form the composite surface. For example, the boundary 403 does not intersect the boundary 402 of the original surface of the workpiece and does not form the composite surface. The boundary 404 does intersect the boundary 402 and can have formed a portion of the composite surface at an earlier time in the simulation. However, at a point of time of the example illustrated in FIG. 4B, the boundary 404 is outside of the composite surface within the cell. Therefore only boundaries 402 and 405 are elements of the optimal subset 559 of distance fields of the cell.

Determining the Optimal Subset of Distance Fields

Figure 5A:
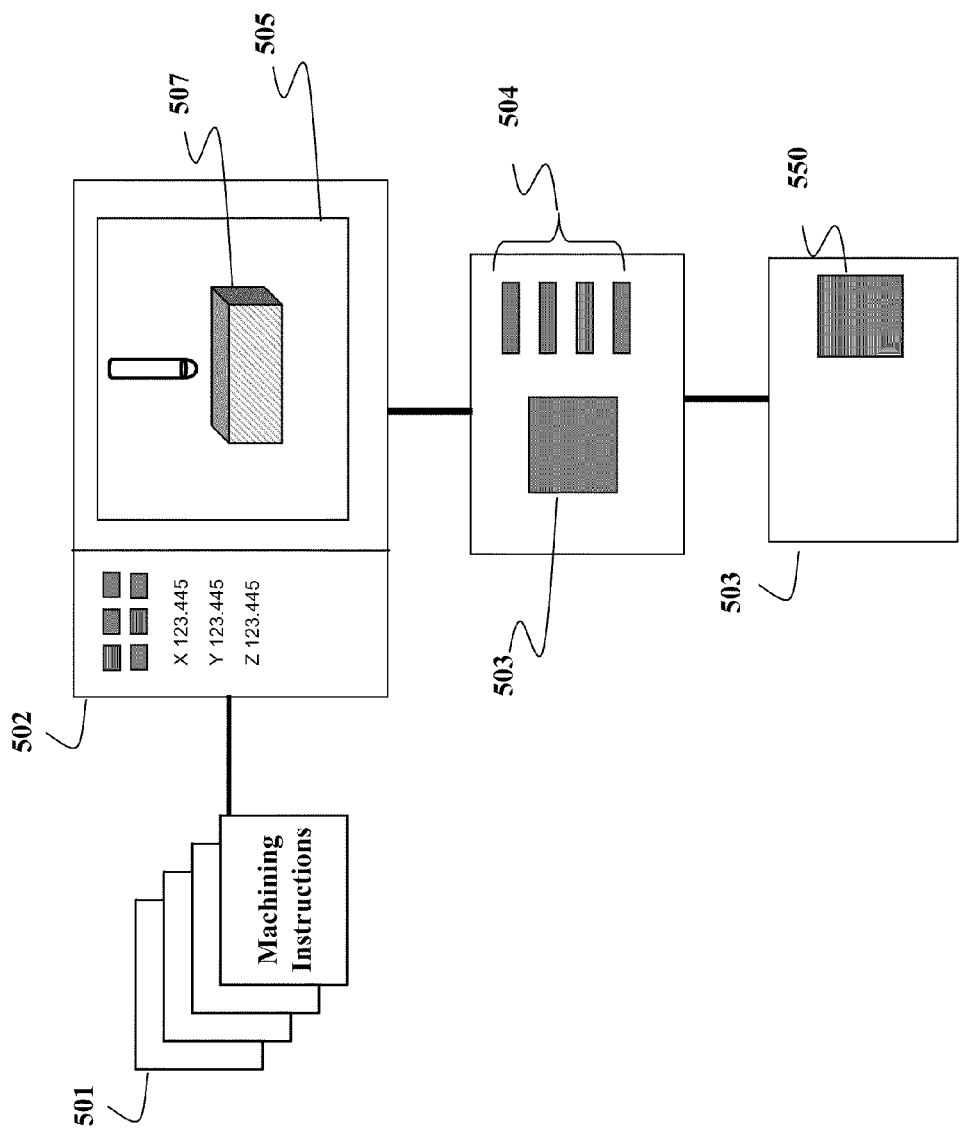
FIG. 5A is a schematic of an embodiment of the invention in an industrial settings.

FIG. 5A illustrates one embodiment of the invention. The set of machining instructions 551 is provided to an NC machining controller 502 either as a file over a network, from a CD or DVD, or by other means known in the art. The controller 502 includes of a processor 503, memory 504 and a display 505 for showing the operation of the machine. Running on the processor is a machining simulator 506 that received the milling instructions 551 and employs embodiments of the invention 500 to produce an image 507 of the simulated workpiece on the display 505.

Figure 5B:
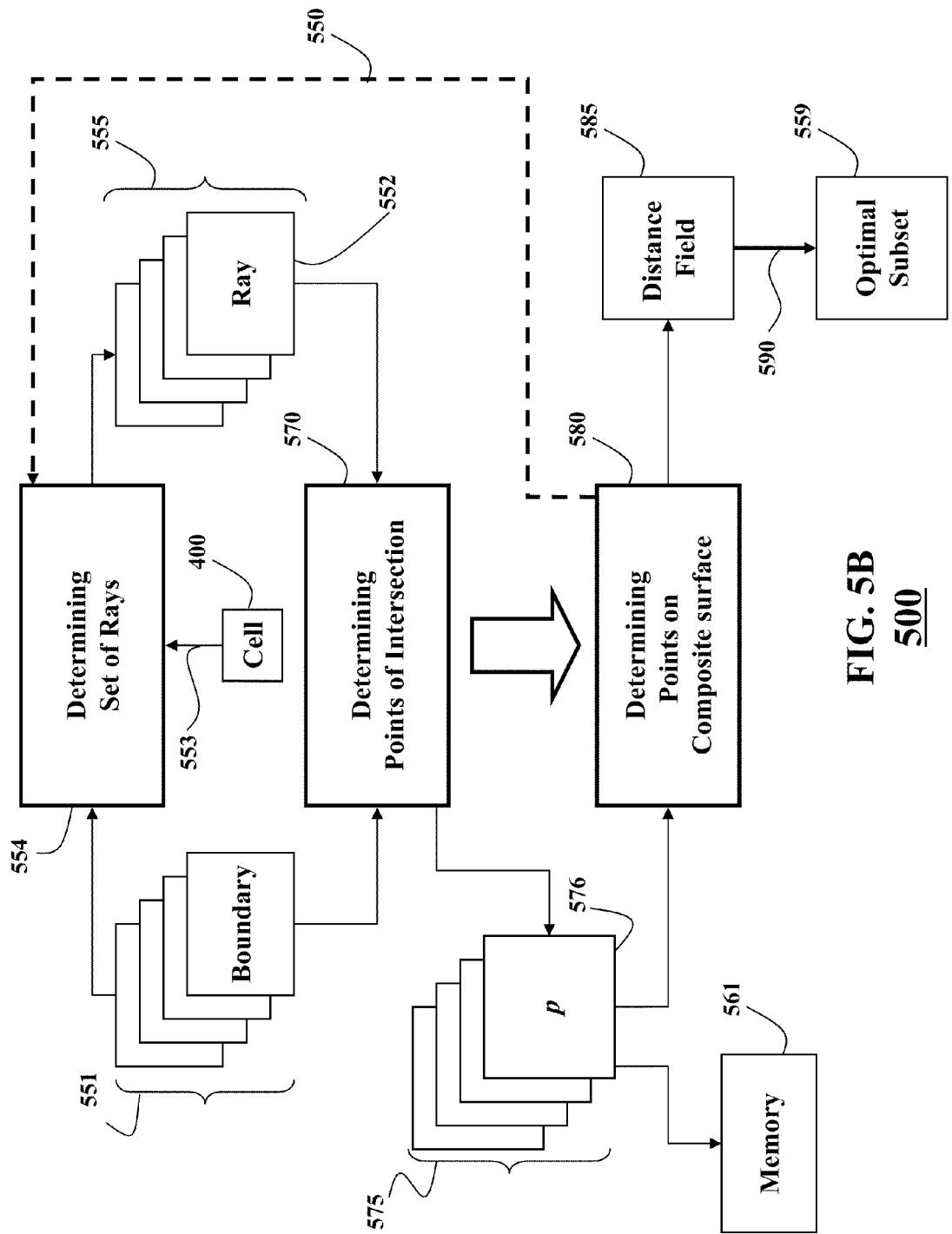
FIG. 5B is a flow diagram of method for determining the minimal list of swept tool boundaries necessary to correctly represent the composite surface of a milling workpiece according an embodiment of the invention.

FIG. 5B is a block diagram of a method 500 for determining the optimal subset 559 of distance fields associated with the cell 400. The subset 551 of the distance fields and a set 555 of rays are inputs to the method. The subset of distance fields represents boundaries of the swept volumes intersecting with the cell. The method is performed by a processor 503 as known in the art. In various embodiments, the cell 400 has different shapes, and/or dimensions.

The subset of distance field is selected from a set of distance fields using, e.g., the boundary/cell intersection method described above. In one embodiment, the boundary/cell intersection method determines a maximum of the absolute value of each of x, y and z components of a surface normal vector of the boundaries of the swept volumes within the cell.

Each ray 552 from the set of rays is indentified by a point of origin and a direction of propagation. The set of rays is determined 554 such that the rays are incident to the cell 400. In one embodiment, the set of rays is determined based on the subset 551, and a range of orientations 553 of boundaries within the cell.

Various embodiments of the invention use different methods to determine the set of rays. For example, in one embodiment, the set includes the rays propagated from a particular direction, only if the maximum component of the surface normals of the boundaries in the particular direction is greater than a threshold.

For each ray 552 in the set of rays, the embodiments use aforementioned analytic and/or iterative methods to determine 570 a set of points of intersection 575 between the ray and the boundaries 551. If a point of intersection 576 of the ray with a boundary is determined 580 to be on the composite surface, a distance field 585 representing the boundary is selected 540 in the optimal set. After all rays in the set of rays are processed, the optimal subset of distance fields is determined.

Determining Set of Rays

Figure 6:
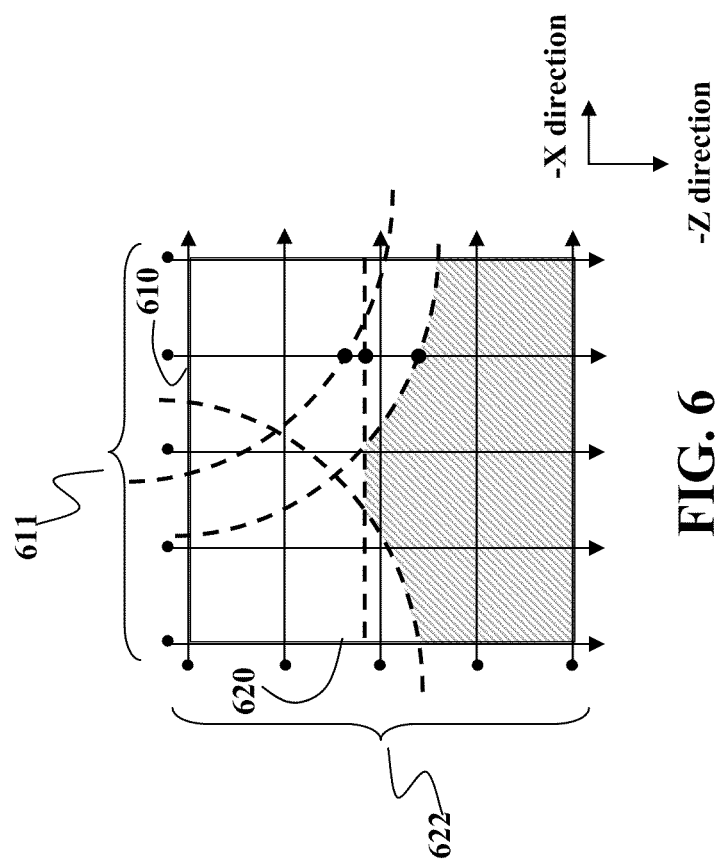
FIG. 6 is a 2D schematic illustrating a set of ray on a regularly spaced grid according an embodiment of the invention.

FIG. 6 shows an example of determining subsets 611 and 622 of the set of rays 555 according one embodiment of the invention. A subset 611 of rays originates from a square, evenly spaced grid of points outside of a first border 610 of the cell and propagates through the cell perpendicular to the first border. Another subset 622 of the set of rays originates from outside of a second border 620 of the cell, perpendicular to the first border, and propagates perpendicular to the second border. In a 3D implementation of the embodiment, a third subset of the set of rays originates outside of a third border, perpendicular to the first two borders, and propagates perpendicular to the third border. In one embodiment, such a regular set of rays is sufficient to determine the optimal subset.

However, other embodiments modify the regular set of rays. For example, in one embodiment, a set of flat end milling tool sweeps move through the cell with identical heights and tool orientations, such that the boundaries of the swept volumes within the cell are locally identical to each other. In this embodiment, a single ray is sufficient to determine the optimal subset.

Figure 7:
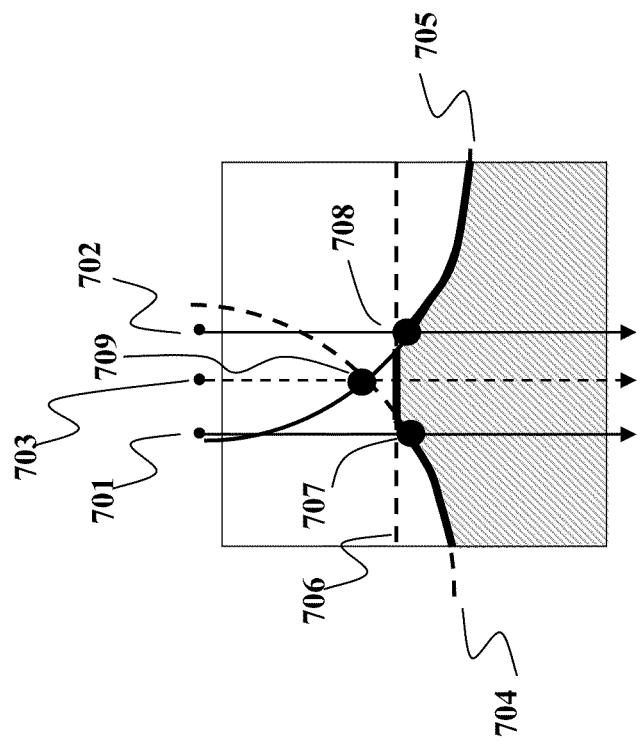
FIG. 7 is a 2D schematic illustrating a method for determining the set of rays according an embodiment of the invention.

FIG. 7 shows an alternative embodiment of the invention. In this embodiment, the rays 701 and 702 are propagated and determined that boundaries 704 and 705 are in the optimal subset. However, the boundary 706, which is also part of the optimal subset, was missed producing an incorrect composite surface.

To avoid defects in the composite surface caused by an incomplete subset of rays, one embodiment includes an adaptation process 580 shown in FIG. 5B. During the determining 580, the adaptation process identifies whether a sampling of the composite surface performed by the rays is sufficient to obtain an accurate optimal subset. If it is not, either fewer or additional rays are propagated.

For example, intersection point 707 of the ray 701 with the boundary 704 and intersection point 708 of the ray 702 with the boundary 705 are close to the boundary 706, such that the normals to the surfaces of the boundaries 704 and 705 at the points 707 and 708 indicate that the boundaries 704 and 705 cross the boundary 706 at a point 709 between the rays 701 and 702. Therefore, an additional ray 703, is propagated to increase the sampling of the composite surface in order to improve the accuracy of the optimal subset.

Caching

One embodiment of the invention determines the optimal subset each time the subset 551 of distance fields of the cell is changed. For example, a milling simulator produces an updated image of the composite surface of the workpiece for each instruction in the milling program. To minimize the rendering time of the image, it is necessary to update the optimal subset of distance fields for each cell of the ADF changed by a new distance field generated by a milling instruction. One variation of the embodiment caches data, e.g., the points of intersection 575, in a memory 561 to accelerate the method 550. The memory 561 can be any memory known in the art, such as a random access memory (RAM). For each milling instruction, the optimal subset is updated, i.e., the distance field is added and/or removed, or the optimal subset is unchanged.

FIG. 8A-8B show an example of a block of computer memory 800 allocated as the memory. The block is subdivided into M equally sized sub-blocks 801 that can each store data for one cell. Each sub-block is further subdivided into N locations 803. Each location is associated with one ray. For example, the data are the intersection point of the ray with the composite surface and a number uniquely identifying the distance field whose boundary forms the composite surface at the ray. For rays where there is no composite surface a flag value, for example a number −1, is stored in place of the distance field identifier.

Each sub-block is associated with a sub-block ID 804, which serves as an identifier of the cell whose data are currently stored within the sub-block. For example, in one embodiment, a unique cell identifier number is formed from combination of x, y, and z coordinates of a position of the cell in the workpiece.

Figure 9:
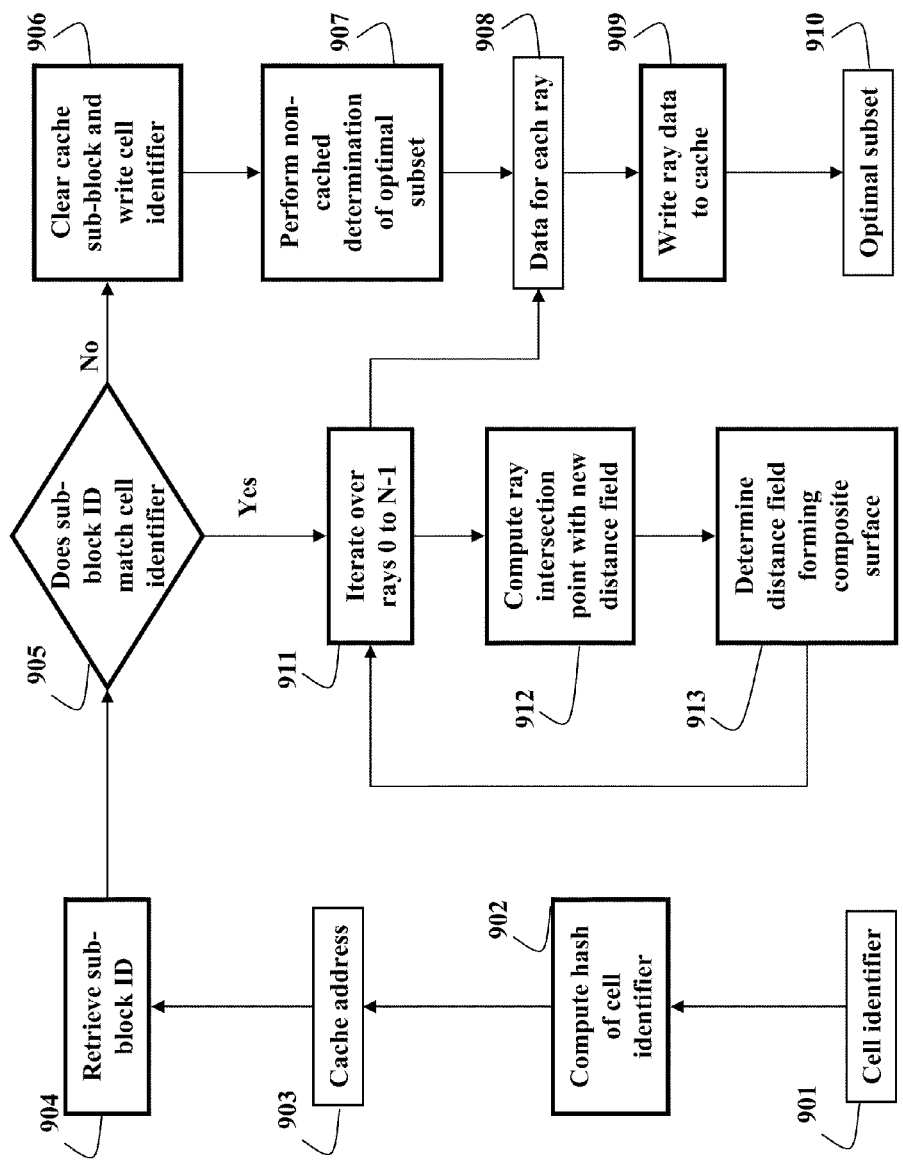
FIG. 9 is a flow diagram of a method 900 for determining the optimal subset using the memory.

FIG. 9 is a flow diagram of a method 900 for determining the optimal subset using the memory. The cell identifier 901 is formed. A hash function 902 maps the cell identifier from a large range to a desired range of [0, M−1] corresponding to the number of cache sub-blocks. An example hash function is out(k)=k modulo M, which maps the input cell identifier value k to an output value out that is within the desired range using the modulo math function. The output value from the hash function is used as the address 903 of the cache sub-block that stores the data for the cell.

To confirm that the sub-block stores the data for the correct cell, the sub-block ID is retrieved from the cache 904 and compared with the cell identifier 905. If the identifiers do not match, then the sub-block is cleared for use by the current cell and the sub-block ID is written with the cell identifier 906. The determination 907 of the optimal subset proceeds in a non-cached fashion as previously described and the data for each ray 908 are stored to the cache 909 to be used for updating the optimal subset.

Alternatively, when the values match, the data in the sub-block are used for determining the optimal subset. Hence, the method 900 iterates 911 over all of the rays. For each ray, the points of intersection are computed only for a new distance field 912, and the point of intersection point is used to determine the distance field boundary that forms the composite surface for the ray.

FIG. 10 shows four possible outcomes of the determining 913 depending on whether there is an intersection of the ray with the new distance field within the cell and whether there are data in the cache for that ray, i.e. the distance field identifier is ≠−1.

Figure 11B:
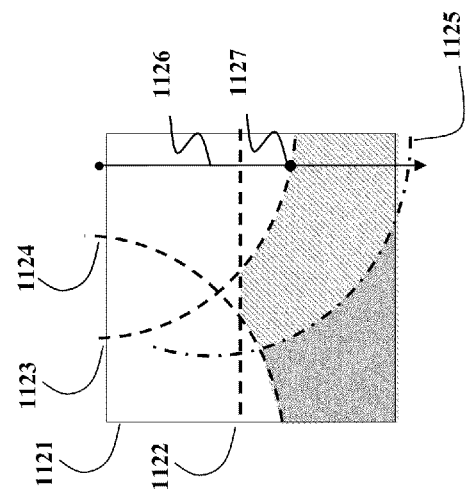
Figure 11C:
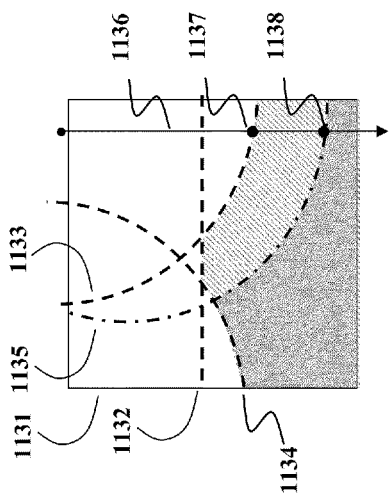
Figure 11A:
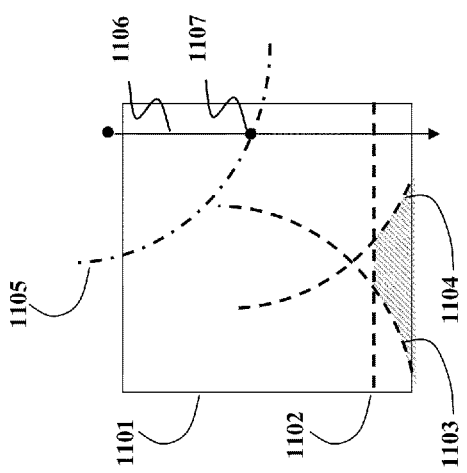

FIG. 11A-C examples of three aforementioned cases, because if there is no intersection and no cached data, then nothing is learned from the ray.

In FIG. 11A, currently associated with cell 1101 are distance fields 1102, 1103 and 1104 and distance field 1105 is the new distance field. The ray 1106 intersects the boundary of distance field 1105 at point 1107 and the cache contains no data for ray 1106. Therefore, the distance field values at the intersection point 1107 of the subset of distance fields currently within the cell 1102-1104 are computed.

If the values of the distances fields at the intersection point are all positive, i.e., more than 0, the new distance field forms the composite surface for this ray and is added to the optimal subset. In the example illustrated in FIG. 11A, the distance fields values are all negative so distance field 1105 is not added to the optimal subset.

In FIG. 11B, currently associated with cell 1121 are distance fields 1122-1124 and distance field 1125 is the new distance field. Ray 1126 does not intersection the boundary of distance field 1125 within the cell, but the cache contains the intersection point 1127 of ray 1126 with the boundary of distance field 1123. In this case there is no intersection, but the cache contains valid data for the ray, then the value of the new distance field is determined at the cached intersection point.

If the value is positive, then the cached distance field is added to the optimal subset. In the illustrated example the intersection point 1127 is outside of distance field 1125 meaning that the cached distance field is not added to the optimal subset due to ray 1126. It is important to understand that this does not preclude the possibility that distance field 1126 will be added to the optimal subset due to another ray.

Finally, in FIG. 11C, currently associated with cell 1131 are distance fields 1132-1134 and distance field 1135 is the new distance field. Ray 1136 intersects the boundary of distance field 1135 at point 1138 and the cache contains the intersection point 1137 of ray 1136 with the boundary of distance field 1133. In this case, there is an intersection point and there is valid cached data, then the value of the cached distance field 1133 is computed at the new intersection point 1138.

If the value is positive, then the new distance field 1135 is added to the optimal subset. Otherwise the cached distance field 1133 is added to the optimal subset. In this example intersection point 1138 is inside the boundary of distance field 1133 (i.e., d>0) and so distance field 1135 is added to the optimal subset.

After all rays have been processed the data for each ray are written to the cache and the optimal subset 910 is complete.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for optimizing a simulation of a machining of a workpiece performed by removing a set of swept volumes from a volume of the workpiece, wherein the volume of the workpiece is partitioned into a set of cells, comprising the steps of:
    associating with each cell a subset of distance fields representing a subset of swept volumes intersecting with the cell, wherein at least part of the subset of swept volumes forms a composite surface of the cell;
    subjecting the cell with a set of rays incident to the cell from at least one direction, wherein each ray represents a propagation of a straight line; and
    selecting a distance field of the subset of distance fields into an optimal subset associated with the cell, wherein a boundary of the swept volume represented by the distance field intersects with at least one ray at a point of intersection lying on the composite surface, wherein the steps of the method are performed by a processor.

2. The method of claim 1, further comprising:
    determining a value of each distance fields from the subset of distance fields at the point of intersection; and
    selecting the distance field into the optimal subset, if the value of the distance filed at the point of intersection is zero, and values of remaining distance fields in the subset are positive.

3. The method of claim 1, wherein a value of the distance field at the point of intersection is zero, and values of remaining distance fields in the subset at the point of intersection are positive.

4. The method of claim 3, wherein $d_i(p)=0$ for $i=j\epsilon[1, N]$ and $d_i(p)>0$ for $i \neq j$, wherein the subset of distance fields includes N distance fields indexed by $i\epsilon[1, N]$, $d_i(p)$ defines the values of the distance fields at the point of intersection p, and j is an index of the distance field selected in the optimal subset.

5. The method of claim 1, further comprising:
    determining the point of intersection located within the cell.

6. The method of claim 1, further comprising:
    originating the ray at a point outside of the cell.

7. The method of claim 1, wherein the rays from one direction are parallel to each other, and wherein the rays from different directions are perpendicular to each other.

8. The method of claim 1, further comprising:
    propagating the set of rays toward the cell from at least two directions.

9. The method of claim 1, further comprising:
    determining the set of the rays based on normals to the composite surface.

10. The method of claim 1, further comprising:
    updating the set of swept volumes; and
    determining, in response to the updating, the optimal subset of distance fields.

11. The method of claim 10, further comprising:
    caching in a memory at least part of data computed during the determining.

12. The method of claim 11, further comprising:
    subdividing the memory into equally sized sub-blocks, each sub-block stores data for one cell; and
    subdividing the sub-block into locations, each location is associated with one ray.

13. The method of claim 12, wherein the data in the location identifies the distance field representing the boundary intersecting with the ray at the point of intersection.

14. The method of claim 12, wherein the data in the location identifies that the ray does not intersect the composite surface.

15. The method of claim 1, wherein a value of the distance field representing the swept volume is negative for an interior of the swept volume.

16. A method for optimizing a simulation of a milling of a workpiece performed by removing a set of swept volumes from a volume of the workpiece, wherein the volume is partitioned into a set of cells, and each cell is associated with a subset of swept volumes intersecting the cell such that at least part of the subset of swept volumes forms a composite surface of the cell, comprising the steps of:
    subjecting the cell with a set of rays incident to the cell, wherein a ray represents a propagation of a straight line toward the cell; and
    selecting a swept volume of the subset of swept volume into an optimal subset associated with the cell, wherein a boundary of the swept volume intersects with at least one ray at a point of intersection lying on the composite surface, wherein the steps of the method are performed by a processor.

17. The method of claim 16, further comprising:
    determining a set of distances between the point of intersection of the boundary and points of intersection of the ray with boundaries of remaining swept volumes in the subset; and
    selecting the swept volume into the optimal subset, if each distance in the set of distances is positive.

18. A system for optimizing a simulation of a milling of a workpiece performed by removing a set of swept volumes from a volume of the workpiece, wherein the volume is partitioned into a set of cells, comprising:
    means for associating each cell with a subset of distance fields representing a subset of swept volumes intersecting with the cell, wherein at least part of the subset of swept volumes forms a composite surface of the cell;
    means for subjecting the cell with a set of rays incident to the cell from at least one direction, wherein each ray represents a propagation of a straight line; and a processor configured to select a distance field of the subset of distance fields into an optimal subset associated with the cell, wherein a boundary of the swept volume represented by the distance field intersects with at least one ray at a point of intersection lying on the composite surface.

19. The system of claim 18, further comprising:

means for determining a value of each distance fields from the subset of distance fields at the point of intersection; and means for selecting the distance field into the optimal subset, if the value of the distance filed at the point of intersection is zero, and values of remaining distance fields in the subset are positive.

20. The system of claim 18, further comprising:

means for caching in a memory at least part of data computed by the means for the determining;

means for subdividing the memory into equally sized sub-blocks, each sub-block stores data for one cell; and means for subdividing the sub-block into locations, each location is associated with one ray.

* * * * *